United States Patent [19]

Delahoy

[11] Patent Number: 4,849,029
[45] Date of Patent: Jul. 18, 1989

[54] ENERGY CONVERSION STRUCTURES

[75] Inventor: Alan E. Delahoy, Rocky Hill, N.J.

[73] Assignee: Chronar Corp., Princeton, N.J.

[21] Appl. No.: 162,076

[22] Filed: Feb. 29, 1988

[51] Int. Cl.⁴ .................................... H01L 31/06
[52] U.S. Cl. ............................ 136/249; 136/256; 136/258; 357/30
[58] Field of Search ............. 136/244, 256, 258 AM, 136/249 TJ; 357/30 J, 30 K, 30 Q

[56] References Cited

FOREIGN PATENT DOCUMENTS

| 60-149178 | 8/1985 | Japan | 136/244 |
| 61-284973 | 12/1986 | Japan | 136/244 |
| 61-284974 | 12/1986 | Japan | 136/244 |

Primary Examiner—Aaron Weisstuch
Attorney, Agent, or Firm—George E. Kersey

[57] ABSTRACT

Energy responsive apparatus in which a semiconductor is in contact with an energy transmissive conductor. An electrode with insulated face and side surfaces has an uninsulated surface in contact with the semiconductor, and a further electrode is in contact with the energy transmissive conductor and the semiconductor simultaneously. Or the energy transmissive conductor is in simultaneous further contact with the semiconductor and the further electrode. The insulator is an oxide of the electrode material.

15 Claims, 5 Drawing Sheets

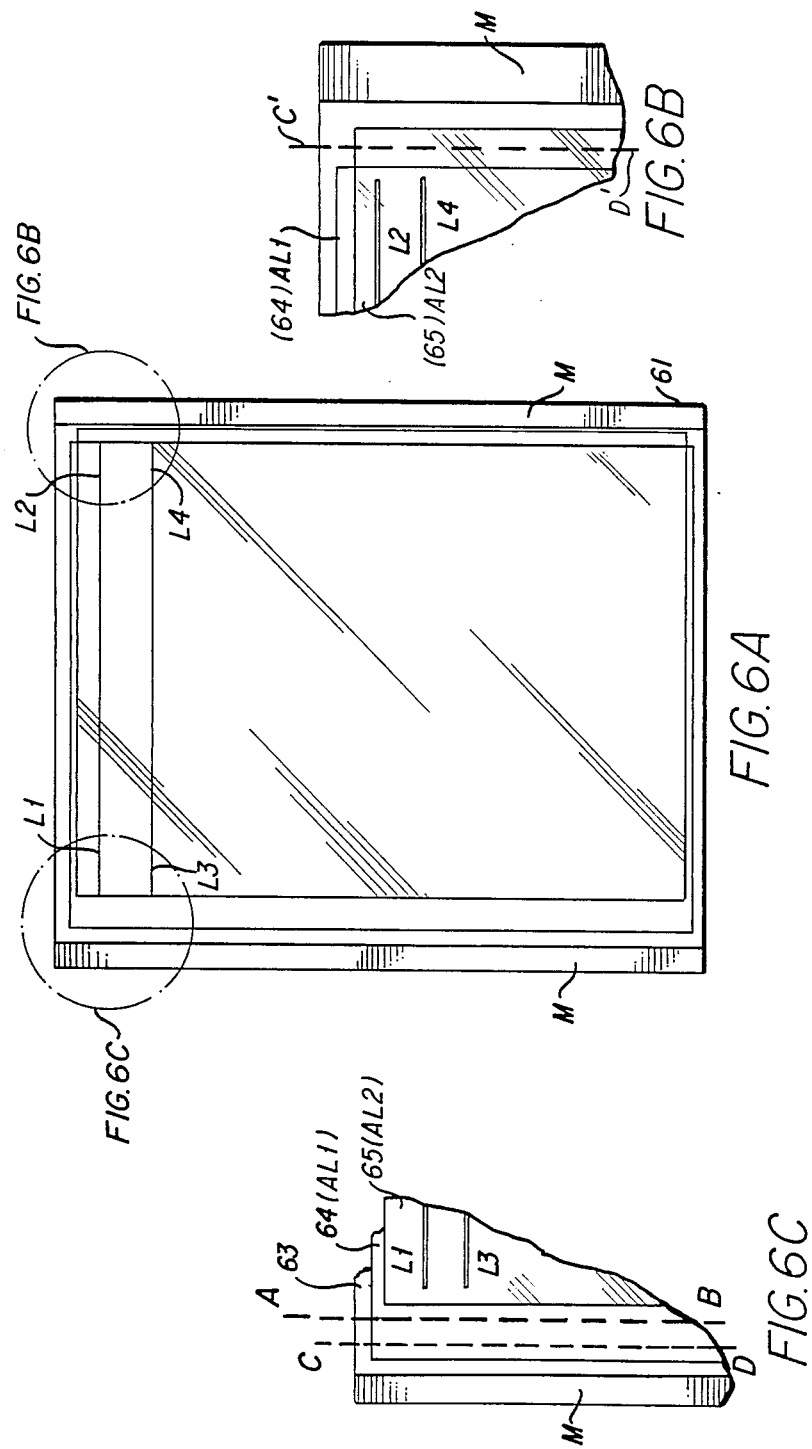

4,849,029

ENERGY CONVERSION STRUCTURES

BACKGROUND OF THE INVENTION

This invention relates to structures for conversion of energy, and more particularly to the conversion of radiant energy into electricity by photovoltaic panels which are suitable for relatively high current and low voltage applications.

Photovoltaic panels are formed by a photo-sensitive element that is sandwiched between two conductors. A typical photo-sensitive element is a semiconductor such as silicon or germanium either in crystalline or amorphous form. To allow radiant energy access to the semiconductor, at least one of the contacting conductors is transparent to the energy being converted. In addition, where the semiconductor is formed by deposition, a transparent support, i.e., substrate such as glass, is the base upon which the deposits are made. As a result the semiconductor energy converter has a transparent conductor on a glass support with an overlying semiconductor, followed by a further conductor which need not be transparent.

Since transparent conductors commonly present a finite sheet resistance, on the order of 5 to 15 ohms per square for materials such as doped tin oxide, it is necessary to limit the travel path in the transparent conductor for collected current generated by the semiconductor to avoid significant resistance losses. As a result, it is common practice to periodically scribe the transparent conductor, giving it a maximum width on the order of about 1 centimeter in order to avoid excessive resistance losses. The resulting structure then has approximately 30 cells per foot, with each width between scribes constituting a cell. The cells are then connected in series.

In order to make the desired series connection, it is necessary to make further scribings on successive overlying layers. Besides the first scribings which divide the conductive transparent oxide into isolated strips on the glass substrate, it is also necessary to scribe the overlying film or layer of semiconductor, such as amorphous silicon. When the rear electrode (conductor) is deposited upon the semiconductor, it is necessary to scribe it as well.

Consequently, in the fabrication of the typical photovoltaic panel, it necessary to make three successive sets of scribings for three successive layers. These scribings must be accurately registered and must be as close as possible in order to limit the extent of photovoltaically inactive or dead area. This is the area that is encompassed by the scribe boundaries between which the photovoltaic panel is inactive. It is apparent that the wider the area that is subjected to scribing, the greater is the amount of dead area in the panel and consequently the greater is the reduction in energy conversion. On the other hand, when an attempt is made to move the scribings too closely together, there is a danger of the scribings overlapping or intersecting, resulting in short circuiting.

Another characteristic associated with conventional photovoltaic panels formed by series-connected cells is the high open circuit voltage of the panel. Each cell has a voltage level, in the case of amorphous silicon, on the order of 0.8 volt. Where there are 30 cells per foot, the total open circuit voltage of the series connected cells is on the order of 24 volts.

While a 24 volt output is suitable for many applications, it is not usable where low voltages and high currents are required. For example, in the electrolysis of water to produce hydrogen for fuel cells, it is desirable to have a relatively low voltage and high current. It is not possible, with current technology, to realize low voltage photovoltaic panels that are efficient and suitable.

Accordingly, it is an object of the invention to reduce the amount of dead space associated with the scribing of successive layers in photovoltaic panels. A related object is to achieve a larger active area for a photovoltaic panel of a given panel size.

Another object of the invention is to reduce the number of scribing steps needed in the formation of a photovoltaic panel. A related object is to simplify the scribing of the layers used in forming photovoltaic panels.

Still another object is to reduce the criticality associated with the registration of successive scribing steps. A related object is to completely eliminate the need for the registration of successive scribes.

Still another object of the invention is to achieve a large area panel that can be used for low voltage and high current applications while simultaneously having a small percentage of inactive area.

SUMMARY OF THE INVENTION

In accomplishing the foregoing and related objects, the invention provides energy responsive apparatus with an energy transmissive conductor, a semiconductor in contact with the energy transmissive conductor, an insulatable electrode in contact with the semiconductor, an insulator upon the insulatable electrode, and a further electrode isolated from the insulatable electrode and in multiple contact with the energy transmissive conductor.

In accordance with one aspect of the invention a panel includes (a) the energy transmissive conductor as a layer, (b) a set of semiconductor segments upon the transmissive conductor layer, (c) insulated electrode segments upon the semiconductor segments, and (d) an electrode layer positioned upon the electrode segments extending into multiple contact with the energy transmissive conductor.

In accordance with another aspect of the invention a panel includes the further electrode as a base, a set of insulated electrode segments are upon said base, a set of semiconductor segments are upon the insulated electrode segments, and an electrode layer formed by the energy transmissive conductor extending into multiple contact with the base.

In accordance with a further aspect of the invention, the transmissive conductor is transparent to radiation and the semiconductor is composed of amorphous and possibly microcrystalline layers. The insulatable electrode can be metallic, such as aluminum, and the insulator can be a metallic oxide. Alternatively, the insulator can be formed by employing an interlayer dielectric (such as a polyimide) which is deposited on the insulatable electrode and patterned simultaneously with the underlying layers. The semiconductor can be a body of amorphous silicon including P, I and N regions.

In a method of fabricating an energy responsive device in accordance with the invention, a base layer is provided, a semiconductor layer is placed upon the base layer, a first conductive layer is formed in contact with the semiconductor layer, scribing takes place through at least the semiconductor and conductive layers, the conductive layer is insulated and a second conductive layer is deposited upon the inscribed layers.

Pursuant to one aspect of the method, the base layer is scribed and a conductive substrate is provided underlying the scribed base layer, with the deposited conductive layer being transparent to radiation and extending into contact with the conductive substrate.

Pursuant to another aspect of the method, the base layer is energy transmissive, and underlies the semiconductor layer, the first conductive layer overlies the semiconductor layer, and the semiconductor and conductive layers are scribed to the level of the energy transmissive layer. The layers can be scribed simultaneously.

In addition, the conductive layer can be insulated by anodization, for example by oxide formation. The base layer can be tin oxide. Multiple scribings can be included to form a set of individual cells which are joined by the overlying deposited conductive layer. The individual cells are thereby joined in parallel, effectively forming a single large area cell.

Further, two or more groups of parallel-connected cells can be serially interconnected via appropriate processing steps to form a series/parallel array of cells on an individual substrate in order to generate any prescribed open-circuit voltage for the panel.

DESCRIPTION OF THE DRAWINGS

Other aspects of the invention will be come apparent after considering several illustrative embodiments taken in conjunction with the drawings in which:

FIGS. 6A–6C illustrate an embodiment of the invention in which edge metallization is employed for the realization of a practical working structure.

DETAILED DESCRIPTION

Figure 1:
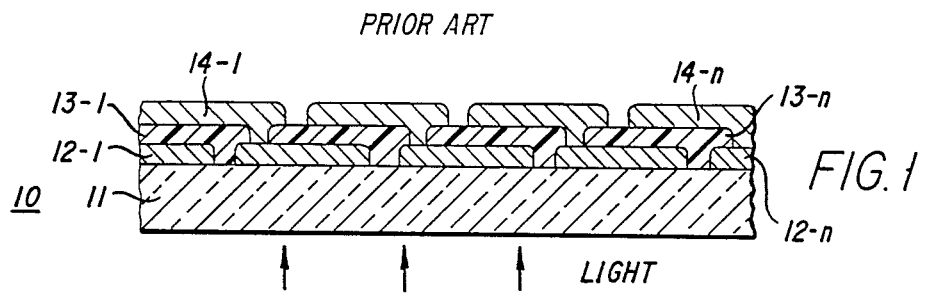
FIG. 1 is a sectional view of a thin film photovoltaic panel in accordance with the prior art.

As illustrated in FIG. 1 a conventional thin film photovoltaic panel 10 employs a glass substrate 11 upon which are strips 12-1 through 12-n of tin oxide. Overlying the tin oxide strips 12-1 through 12-n are descrete amorphous silicon layers 13-1 through 13-n. The structure is completed by overlying discrete layers 14-1 through 14-n of a metal such a aluminum. This structure is in common use for modules or panels which measure 1'×1' and 1'×3'.

In the structure of FIG. 1 each group of layers 12-1, 13-1 and 14-1 forms a cell. The successive cells are series connected. The final structure therefore provides a generated voltage between a terminal electrode associated with the layer 12-1 and a further terminal electrode associated with the layer 14-n. It is necessary, in the case of a structure 10, like that of FIG. 1, to limit the travel of current through the tin oxide. This is because tin oxide provides a finite and appreciable sheet resistance on the order of 5–15 Ohms per square. The current travelling through the tin oxide must be confined to a short distance, on the order of about 1 cm for a panel illuminated by sunlight of intensity approximately 100 in mW/cm$^2$ (milliWatts per square centimeter, i.e., 1 sun), in order to avoid significant resistive losses. This is why the tin oxide is shown in discrete segments in the structure of FIG. 1 and necessitates connecting the various cells in series in order to take maximum advantage of the panel surface that converts incident light into electricity. When each cell has a width of about 1 cm, there are approximately 30 cells per foot formed by periodic scribing of a tin oxide layer formed on the glass substrate.

Figure 2A:
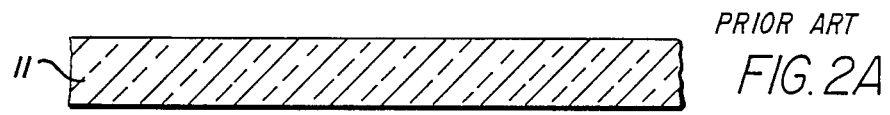
FIGS. 2A–2G illustrate the standard manufacturing steps for the fabrication of thin film photovoltaic panels.
Figure 2B:
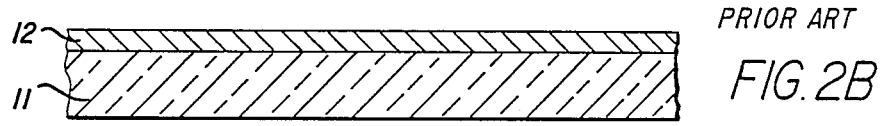

The typical manufacturing process for realizing the photovoltaic panel structure of FIG. 1 is illustrated in FIGS. 2A–2G. FIG. 2A shows the commencement of the process beginning with the provision of a tranparent substrate or support 11 which is illustratively of glass. Once the substrate is provided, it is coated (FIG. 2B) with a transparent conductor 12, such as fluorine-doped tin oxide.

Figure 2C:
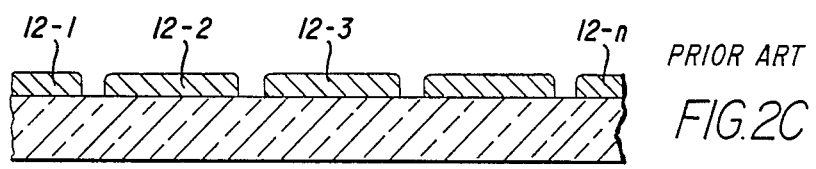

The next step is illustrated in FIG. 2C where the layer 12 of tin oxide is divided into strips 12-1, 12-2, 12-3 and 12-n. It would be understood that only a few strips are shown, but that in a typical example, such as that provided by a standard module or panel that is approximately 1' square, there would be about 30 such strips. The division between strips, for example, the strips 12-1 and 12-2 can be made in any conventional scribing fashion. The scribing may take place mechanically but is more commonly accomplished using a laser, for example a Nd-YAG (neodymium yttrium garnet) laser operating at 1.06 um (micrometer).

Figure 2D:
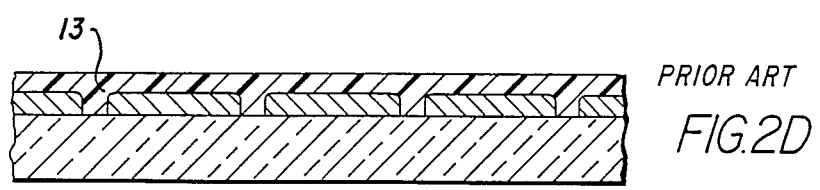

The next step in the manufacturing process is illustrated by FIG. 2D which shows a layer of amorphous silicon deposited on the strips 12-1 through 12-3. When the structure is to take the form of a photovoltaic panel, the amorphous silicon layer 13 includes a rectifying junction. A common form of amorphous silicon deposit is a P,I,N structure that is produced by appropriate doping during the deposition process. The techniques for producing these kinds of amorphous silicon deposits are well known in the art.

Figure 2E:
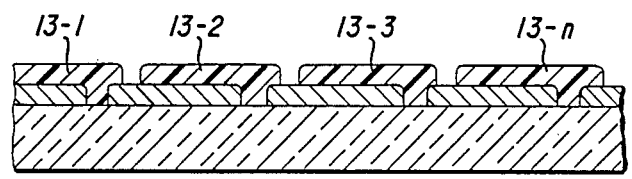

In the next step of processing, illustrated in FIG. 2E, the amorphous silicon layer 13 of FIG. 2D is divided into strips 13-1 through 13-n, corresponding to the tin oxide strips 12-1 through 12-n. The scribing of the amorphous silicon layer 13 can be accomplished in the same fashion as the scribing of the tin oxide layer 12. In particular, the amorphous silicon can be mechanically scribed, or blown off by a laser, in which case use of a frequency-doubled Nd-YAG laser operating at 0.53 μm is recommended to ensure adequate energy absorption in the amorphous silicon. It is desirable to make the scribings of the amorphous silicon layer as close to the scribings of the underlying tin oxide layer as possible in order to reduce the amount of dead space in the overall structure.

Figure 2F:
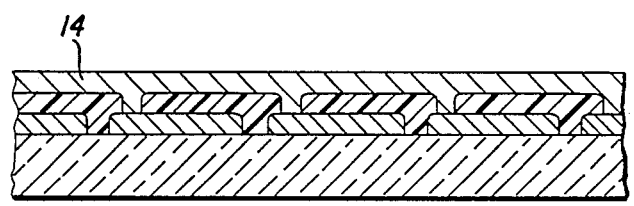
Figure 2G:
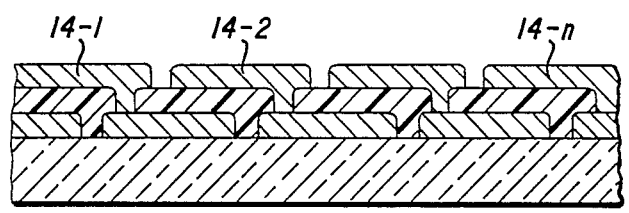

In the next step of processing as illustrated in FIG. 2F, a layer 14 of conductor is deposited on the amorphous silicon strips 13-1 through 13-n. In the final step of processing, as illustrated in FIG. 2G, the overlying metallic layer 14, illustratively of aluminum, is scribed to produce corresponding aluminum strips 14-1 through 14-n. Once again, it is desirable to make the scribings for the aluminum layer 14 as close to the underlying scribings as possible.

The wider the separation of the scribings for the three layers 12, 13 and 14, the wider is the amount of dead space on the panel. Conversely, the closer the scribings, the less the amount of dead space. However, it is not possible to make the scribings too close together for danger of short circuiting. As a result, it is necessary to accurately register the successive scribings.

It is apparent that the photovoltaic panel 10 of FIG. 1, as produced in accordance with the manufacturing steps illustrated by FIGS. 2A through 2G has a number of serious disadvantages. In the first place, it is necessary to make three successive scribings. The second and third scribings must be accurately registered with respect to the first and be as close as possible to the first without short circuiting. The second and third scribings may even be produced on a physically distinct system from that producing the first scribing, thereby compounding the registration problem. In any case, the existence of separated scribings brings about an inactive or dead area of the panel which is formed by the total area occupied between the scribings associated with each cell.

Another disadvantage of the structure shown in FIG. 1 is that the cells are all connected in series. As a result, the panel is not suitable for low voltage applications, such as water electrolysis for the production of hydrogen to be used in fuel cells.

As an example of the disadvantages resulting from the prior art technology, consideration can be given to a typical panel which measures 1'×1'. Such a panel has a total area of 929 sq. cm. There is an area of the panel that is lost to border or edge metallization in order to produce a buss bar by which the various panels can be connected. There is also an area of uncoated glass at the edge. This area amounts to approximately 68 sq. cm. In addition, there is an area lost by interconnection. In the case of 29 cells with 0.12 cm. width occupied by 3 scribes for each cell, times the length of the cell of 29 cm. there is a dead area amounting to about 101 sq. cm. As a result, there is a reduction in the active area of the panel from 929 sq. cm. to about 760 sq. cm.

Figure 3:
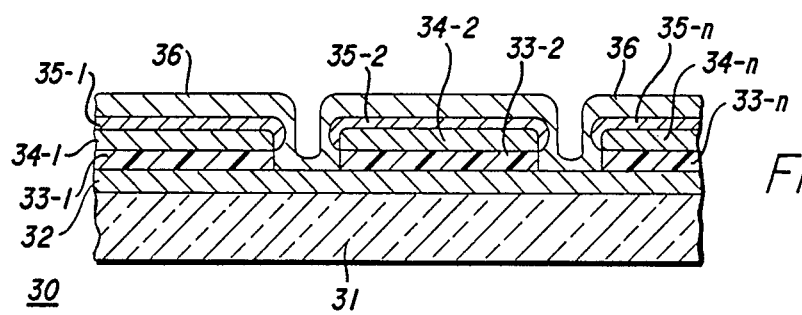
FIG. 3 is a sectional view of an energy sensitive structure in accordance with the invention.

In order to overcome the disadvantages associated with the prior art exemplified by FIGS. 1 and 2A–2G, the invention provides a structure as shown in FIG. 3.

In the illustrative structure 30 of FIG. 3 there is an underlying glass substrate 31 that corresponds and has characteristics similar to the substrate 11 of FIG. 1. Overlying the glass substrate 31 is a layer 32 of tin oxide which corresponds to the layer 12 of tin oxide shown in FIG. 2A. Overlying the tin oxide layer 32 are discrete amorphous silicon strips 33-1 through 33-3. Immediately upon the amorphous silicon strips 33-1 through 33-3 are corresponding metallic strips, typically of aluminum 34-1 through 34-3. However, by contrast with the structure of FIG. 1, the individual metallic strips 34-1 through 34-3 have an insulating oxide layer 35-1 through 35-3. Each oxide layer, for example 35-1, covers the entire outer surface of its associated metallic strip, for example, 34-1. The final element of the structure 31 is an overlying metallic layer 36. The layer 36 extends into the interval between adjoining cells, for example the cell of the first amorphous silicon strip 33-1 and the second amorphous silicon strip 33-2. In addition, the layer 36 is insulated from the various metallic strips 34-1 through 34-3 by their associated oxide layers 35-1 through 35-3.

Finally, the layer 36 extends into contact with the tin oxide layer 31. As a result, a large cell is created with a common bus-bar formed by the layer 36 and electrodes for the individual cells formed by the successive metallic strips 34-1 through 34-3. The strips 34-1 through 34-3 may be commonly joined at their ends so that the structure 30 produces a number of parallel connected cells which provide low voltage and high current output. Such a structure is suitable for the low voltage application described above, namely water electrolysis to produce hydrogen for fuel cells.

Figure 4A:
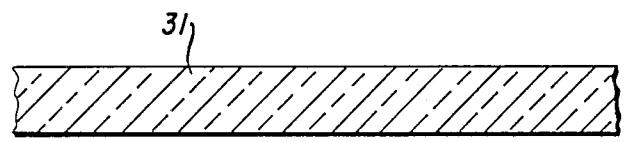
FIGS. 4A–4F illustrate the manufacturing steps for the fabrication of the thin film energy sensitive structure of FIG. 3.
Figure 4B:
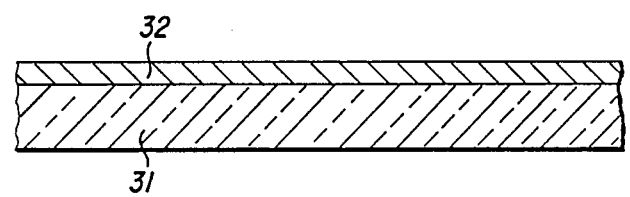
Figure 4C:
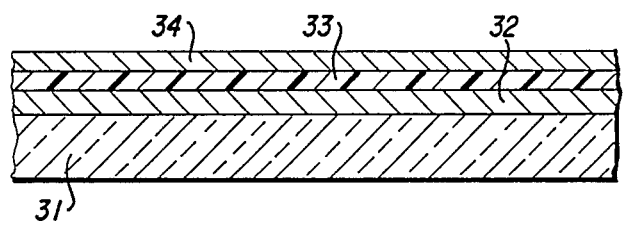

In a manufacturing procedure for producing the structure 30 of FIG. 3, the process begins with a substrate, typically of glass, as shown in FIG. 4A. As previously described, the second step of manufacture is the deposition of a tin oxide coating 32 upon the substrate 31 as shown in FIG. 4B. This is followed, as illustrated in FIG. 4C by the deposition of an amorphous silicon layer 33. The layer 33 has the characteristic described previously in connection with the panel 10 of FIG. 1. In the next step of fabrication, also illustrated in FIG. 4C, a layer 34 of aluminum is deposited.

Figure 4D:
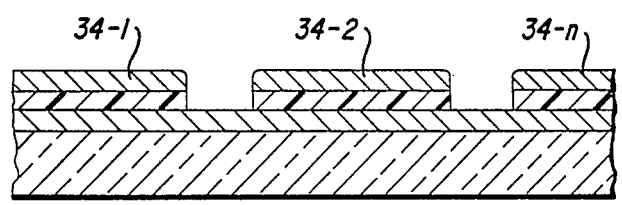

In the next step, by contrast with the prior art, a single set of inscriptions is sufficient to produce the individual cells. This is illustrated in FIG. 4D where the layers 33 and 34 of FIG. 4 have been divided into overlying strip pairs 33-1 and 34-1; 33-2 and 34-2; and 33-3 and 34-3. A suitable technique for inscribing the layers 33 and 34 is in accordance with copending Ser. No. 923,350 filed Oct. 27, 1986 for "Isolation of Semiconductor Contacts" in the name of John Van Dine. In addition, other scribing techniques may be employed which are capable of penetrating two layers of material.

Figure 4E:
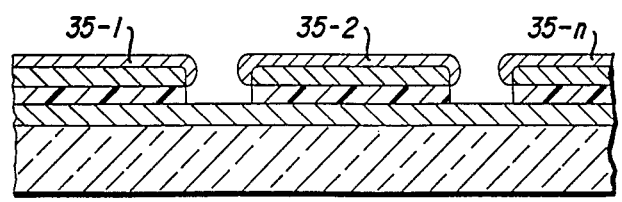
Figure 4F:
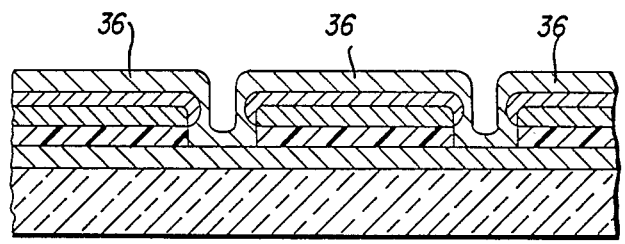

The next step is illustrated in FIG. 4E where the exposed aluminum of the strips 34-1 through 34-3 is anodized to produce an oxide layer of respective oxide strips 35-1 through 35-3. In the final manufacturing step, the layer 36 of aluminum is deposited to produce the result shown in FIG. 4F. The aluminum layer 36 periodically contacts the tin oxide layer 32 at approximately 1 cm. intervals so that a base electrode is formed, which is common to all of the individual cells that are created on the substrate 31.

A comparison of a solar panel in accordance with FIG. 1 as compared with a solar panel in accordance with FIG. 3, when the latter is connected for parallel cell operation, is summarized in the table below:

| TYPE OF PANEL | $V_{oc}$ | $I_{sc}$ | FF |
| --- | --- | --- | --- |
| Series Connected | 24 v. | 0.4 amps | .65 |
| Parallel Connected | 0.8 v. | 12 amps | .65 |

In the foregoing Table $V_{oc}$ represents open circuit voltage, $I_{sc}$ represents short circuit current, FF represents fill factor. The illustrative data in the Table are for solar panels which are 1' sq.

It is apparent from the foregoing Table that the invention provides a panel which can yield high current at comparatively low voltages without substantial losses in the tin oxide layer.

A number of adaptations of the invention are illustrated below.

Figure 5:
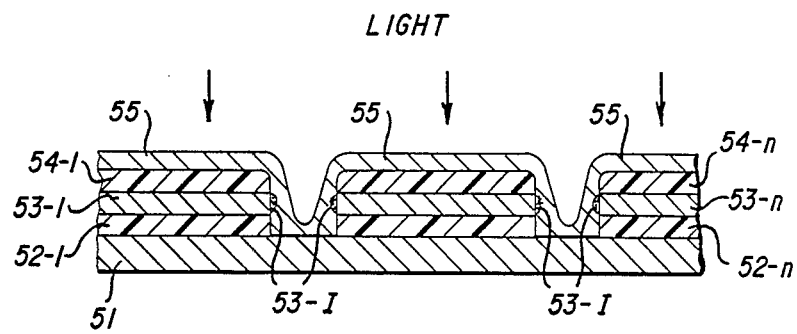
FIG. 5 illustrates an inverted structure in accordance with the invention on a conducting substrate in contrast with the transparent substrate of FIGS. 4A–4F.

FIG. 5 illustrates an inverted structure 50 in accordance with the invention where a metallic substrate 51 is employed in place of the transparent or glass substrate 11 or 31 of FIG. 1 or FIG. 3, respectively. In addition, the structure 50 of FIG. 5 includes insulator strips 52-1 through 52-3 underlying the first metallic strips 53-1 through 53-3 which in turn underly amorphous silicon strips 54-1 through 54-3. The outer edges of the metallic strips 53-1 through 53-3 are oxidized to provide insulation 53—1. The overall structure is covered by a layer 55 of transparent conductor such as indium tin oxide or tin oxide. The layer 55 extends into the interval between adjoining cells into contact with the metallic substrate 51. As a result, the metallic substrate 51 provides a common busbar and the individual cells have second electrodes 53-1 through 53-3. The second electrodes can be connected as described.

It is apparent that the embodiment of FIG. 5 is an inverted structure compared with FIG. 3 where the incident radiation falls on the layer 55, by contrast with the incidence of radiation on the substrate 11 for the embodiment of FIG. 1 or the substrate 31 for the embodiment of FIG. 3.

An embodiment which incorporates edge metallization to permit the soldering of connecting wires to a solar panel is illustrated in FIGS. 6A-6C. In FIG. 6A the deposition of tin oxide takes place over an entire substrate 61 to produce a tin oxide coating 62. Edge metallization "M" as illustrated in FIG. 6B is provided on top of the tin oxide layer 61. It may be fired simultaneously with the production of the tin oxide layer 62. In the next step, a single tin oxide cut is made along the line AB to produce an active cell to the right of the line AB. This is followed by the deposition of an amorphous silicon layer 63 on the tin oxide to within about 2 millimeters of the edge metallization as provided by suitable masking. Thus, the amorphous silicon deposition extends only as far as the lines C-D and C'-D'. This is to expose a portion of the underlying tin oxide adjacent to the edge metallization. In the next step there is the deposit of a first aluminum layer 64. Once the aluminum is deposited, laser scribing takes place through the layers 63 and 64 of amorphous silicon and aluminum along the lines $L_1$-$L_2$, $L_3$-$L_4$, and so forth. In the laser scribing of a a 1' panel there are approximately 29 L—L inscriptions so that the last of the laser inscriptions is designated $L_{59}$-$L_{60}$. Once the inscriptions have been made, anodization is used to grow oxide and insulate the exposed aluminum.

In the final step, a second aluminum layer 65 (hatching) is deposited to contact the right hand busbar. It is insulated from the aluminum and periodically contacts the tin oxide through scribes $L_1$-$L_2$ etc.

Unlike conventional interconnected thin film photovoltaic panels in which scribes lie parallel to the edge metallization or busbar, the scribes in the above embodiment of the present invention are perpendicular to the busbars.

Because of the higher current generated by these panels, consideration is given to the sheet resistance Rs of the first and second metal layers deposited as metallization. The sheet resistance Rs is related to the voltage drop across a square of material over which current is collected uniformly (as in a photovoltaic panel) and extracted from a busbar along the edge metallization (x=o, where "x" denotes a lateral position along the panel). The current I(x) at any position "x" is $I_o$, $I(x) = I_o(I - x/W)$ where $I_o$ is the total current collected and W is the width of the square. Rs is related to the total voltage drop from x=0 to x=W by equation (1).

$$V = \int_0^W I(x)/W R_s dx = I_o R_s/W[x - x^2/2W]_o^W = \tfrac{1}{2} JR_s W^2 \quad (1)$$

where
$R_s$ is the sheet resistance of the material, and
$J(=I_o/W^2)$ is the current density of the collected current.

To produce a relatively small resistance loss in the current-collecting layer (metallization), the voltage drop V in this layer should be low compared to the photo-voltage generated by the solar cell.

The final result of equation (1): $V = \tfrac{1}{2} JR_s W^2$ indicates that the sheet resistance $R_s$ varies inversely as the square of the current-collecting width W of the solar panel. The sheet resistance $R_s$ also varies linearly with V and inversely as J.

The valve $R_s$ is correspondingly reduced if V is made larger and J smaller. This is achieved by tandem cells, for example, of a double stack or triple stack, of elementary cells.

For amorphous silicon the basic structure of a double junction tandem cell is $P_1-i_1-n_1/P_2-i_2-n_2$. In such a cell the voltage generated is twice that of a single junction cell and correspondingly the current is one-half. Likewise, for a triple junction cell, the voltage and current are respectively three times and one third of their values for a single junction cell.

Conversely, for a given sheet resistance $R_s$ equation (1) yields the width W of a solar panel which can be made consistent with small resistive losses in the metallization. This is illustrated for a triple-junction tandem cell based on amorphous silicon and metallized in a conventional manner using vacuum-deposited aluminum roughly 7000 Å in thickness. Such a film has a sheet resistance of about 0.05 ohms per square. The on-load voltage and current density for the triple junction cell are approximately 2 volts and 5 mA/cm$^2$, respectively. If the voltage drop V in the aluminum metallization is on the order of 0.1 volts, J=0.005 A/cm$^2$, $R_s$=0.05 ohm, and an upper limit for W is equal to 28 cm or roughly 1 foot. Consequently, triple-junction amorphous silicon panels formed essentially of a single large cell can be fabricated having a width of 1 foot, without requiring any advances in metallization technology. For example, such panels are conveniently 1 foot square or 1 foot×3 foot. Such a square foot (triple-junction) panel generates approximately 2.5 volts (open-circuited) and 4 amps (short-circuited).

Other aspects of the invention will become apparent to those or ordinary skill in the art.

What is claimed is:

1. Radiant energy responsive apparatus comprising
   a radiant energy transmissive conductor;
   a photoactive semiconductor in contact with said energy transmissive conductor;
   an insulatable electrode having face and side surfaces with one face surface in contact with said semiconductor;
   an insulator confined to face and side surfaces of said insulatable electrode; and
   a further electrode upon said insulated electrode in simultaneous electrical contact with said energy transmissive conductor and said semiconductor.

2. Apparatus as defined in claim 1 comprising a panel including said energy transmissive conductor as a layer, a set of spaced apart semiconductor segments upon the transmissive conductor layer, an insulated electrode segment upon each said semiconductor segment, and an electrode layer upon said electrode segments extending into electrical contact with said energy transmissive conductor and said semiconductor segments.

3. Apparatus as defined in claim 1 wherein said energy transmissive conductor is transparent to radiation and said semiconductor is amorphous.

4. Apparatus as defined in claim 1 wherein said insulatable electrode is metallic, said insulator is metallic oxide and said further electrode is metallic.

5. Apparatus as defined in claim 1 wherein said insulatable electrode and said further electrode are aluminum.

6. Apparatus as defined in claim 1 wherein said semiconductor has a body of amorphous silicon with a plurality of P, I and N regions forming a plurality of junctions.

7. Apparatus as defined in claim 6 wherein said junctions are series-connected.

8. Apparatus as defined in claim 1 forming a solar panel with edge metallization.

9. Energy responsive apparatus as defined in claim 1 wherein said insulatable electrode is oxidizable and said insulator is an oxide of the material of said electrode.

10. An energy responsive device as defined in claim 1 comprising
an energy transmissive conductive layer;
a set of spaced apart semiconductor layers upon said energy transmissive layer;
a conductor upon each semiconductor layer;
an insulating layer upon each conductor; and
a conductive layer upon each insulated conductor extending into electrical contact with said energy transmissive layer and each semiconductor layer.

11. A radiant energy responsive device comprising
a conductor;
an insulator upon said conductor;
an insulatable electrode in contact with said insulator;
a photoactive semiconductor in contact with said insulatable electrode;
said insulatable electrode having an edge extending between said semiconductor and said insulator;
insulation upon the edge of said insulatable electrode; and
a radiant energy transmissive conductive layer upon said semiconductor extending into simultaneous electrical contact with said conductor and said semiconductor.

12. An energy responsive device as defined in claim 11 wherein said electrode is oxidizable and said edge insulation is an oxide of the material of said electrode.

13. An energy responsive device as defined in claim 11 wherein said semiconductor has face and side surfaces and said energy transmissive conductive layer is in contact with a face and a side surface of said semiconductor.

14. Apparatus as defined in claim 11 comprising a panel including said conductor as a base layer, a set of spaced apart insulator segments of said base layer, an insulated electrode segment upon each said insulator segment, a semiconductor segment upon each said insulated electrode segment, and an electrode layer formed by said energy transmissive conductor extending into electrical contact with said base layer and said semiconductor segments.

15. A solar panel comprising
a substrate;
a deposit of tin oxide over said substrate;
an edge of metallization on said tin oxide;
a cut in said tin oxide along said edge of metallization producing an active cell on the unmetallized side of said cut;
a deposit of amorphous silicon of the unmetallized tin oxide within a prescribed distance of the edge metallization,
whereby a portion of underlying tin oxide is exposed adjacent to the edge of metallization;
a first aluminum layer deposited upon said amorphous silicon;
a set of cuts penetrating said amorphous silicon and said first aluminum layer to said tin oxide;
an oxide upon said first aluminum layer; and
a second aluminum layer deposited to contact said edge of metallization and insulated from said first aluminum layer and periodically contacting the tin oxide through said cuts.

* * * * *